United States Patent
Atsumi

(10) Patent No.: US 9,059,719 B2
(45) Date of Patent: Jun. 16, 2015

(54) PHASE DIFFERENCE DETECTION METHOD, PHASE DIFFERENCE DETECTION CIRCUIT, AND WIRELESS POWER TRANSMISSION DEVICE

(75) Inventor: Ken Atsumi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 877 days.

(21) Appl. No.: 13/300,904

(22) Filed: Nov. 21, 2011

(65) Prior Publication Data

US 2012/0126636 A1  May 24, 2012

(30) Foreign Application Priority Data

Nov. 22, 2010  (JP) .................. 2010-260648

(51) Int. Cl.
| | |
|---|---|
| H03L 7/06 | (2006.01) |
| H03L 7/085 | (2006.01) |
| G01R 25/00 | (2006.01) |
| H02J 17/00 | (2006.01) |
| H03L 7/081 | (2006.01) |

(52) U.S. Cl.
CPC .............. *H03L 7/085* (2013.01); *G01R 25/00* (2013.01); *H02J 17/00* (2013.01); *H03L 7/0814* (2013.01)

(58) Field of Classification Search
USPC .................. 327/147–149, 156–158
See application file for complete search history.

(56) References Cited

U.S. PATENT DOCUMENTS

| | | | |
|---|---|---|---|
| 5,952,853 A | 9/1999 | Willingham et al. | |
| 6,940,323 B2 | 9/2005 | Katoh et al. | |
| 7,193,401 B1* | 3/2007 | Hasegawa | 323/283 |
| 7,518,963 B2* | 4/2009 | Tokuyama | 369/47.28 |
| 2002/0159554 A1* | 10/2002 | Nosaka et al. | 375/376 |
| 2003/0038659 A1* | 2/2003 | Takahashi et al. | 327/141 |
| 2004/0223572 A1* | 11/2004 | Brown et al. | 375/375 |
| 2007/0120585 A1* | 5/2007 | Kishibe | 327/156 |
| 2008/0285598 A1* | 11/2008 | Farbarik et al. | 370/516 |
| 2009/0052602 A1* | 2/2009 | Annampedu | 375/376 |
| 2009/0243850 A1* | 10/2009 | Nishizato | 340/541 |
| 2010/0213993 A1* | 8/2010 | Hongo | 327/156 |
| 2012/0126636 A1* | 5/2012 | Atsumi | 307/149 |
| 2012/0218430 A1* | 8/2012 | Yanagidate | 348/211.2 |
| 2013/0162312 A1* | 6/2013 | Jung et al. | 327/158 |

FOREIGN PATENT DOCUMENTS

| | | |
|---|---|---|
| JP | 08-316828 A | 11/1996 |
| JP | 09-9285 A | 1/1997 |
| JP | 11-289249 A | 10/1999 |
| JP | 2004-120515 A | 4/2004 |

OTHER PUBLICATIONS

Japanese Office Action; Japanese Patent Application No. 2010-260648 dated Feb. 25, 2014.

* cited by examiner

*Primary Examiner* — Adam Houston
(74) *Attorney, Agent, or Firm* — Arent Fox LLP

(57) ABSTRACT

A method used by a phase difference detection circuit for detecting a phase difference between two signals includes shifting a detected phase difference between the two signals by an offset value, outputting the detected phase difference, and controlling the offset value such that the outputted detected phase difference falls within a phase difference range between a lower limit and an upper limit.

9 Claims, 20 Drawing Sheets

FIG. 7

| D-FF42 OUTPUT | D-FF44 OUTPUT | EXOR46 OUTPUT PP |
|---|---|---|
| L | L | L |
| L | H | H |
| H | L | H |
| H | H | L |

32H: UPPER LIMIT DETERMINING UNIT
32L: LOWER LIMIT DETERMINING UNIT
52,53: COMPARATOR

FIG. 10A
(Op,Vth-HI,Vth-LO)
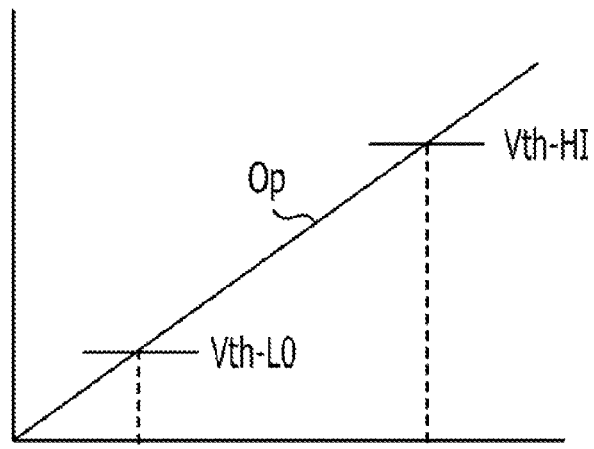
FIG. 10B
(COMPARATOR 52 OUTPUT)
FIG. 10C
(COMPARATOR 53 OUTPUT)
FIG. 10D
(EXOR 50 OUTPUT)
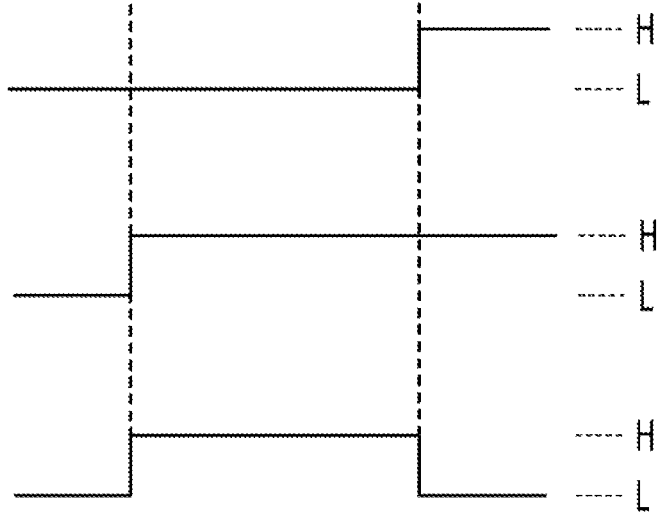

FIG. 11

| COMPARATOR 52 OUTPUT | COMPARATOR 53 OUTPUT | EXOR 50 OUTPUT |
|---|---|---|
| L | L | L |
| L | H | H |
| H | L | H |
| H | H | L |

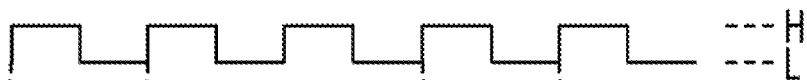
FIG. 20A [INPUT1]
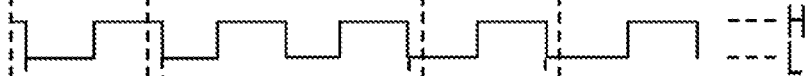
FIG. 20B [INPUT2]
FIG. 20C [COMPARATOR OUTPUT]
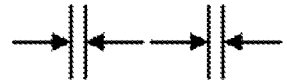
$\Delta\theta$  $\Delta\theta$    $\Delta\theta$  $\Delta\theta$
$(+180-\Delta[\text{DEG}])$    $(-180+\Delta[\text{DEG}])$
($\Delta$:FLUCTUATION WIDTH)

PHASE DIFFERENCE DETECTION METHOD, PHASE DIFFERENCE DETECTION CIRCUIT, AND WIRELESS POWER TRANSMISSION DEVICE

CROSS-REFERENCE TO RELATED APPLICATIONS

This application is based upon and claims the benefit of priority from the prior Japanese Patent Application No. 2010-260648 filed on Nov. 22, 2010, the entire contents of which are incorporated herein by reference.

FIELD

The present invention relates to a technique for detecting a phase difference between signals and a technique for controlling the phase between signals.

BACKGROUND

A phase difference detection circuit for detecting a phase difference between two signals is used in phase-locked loop (PLL) circuits and the like in the phase difference detection and phase control of phase difference control feedback (FB) system circuits.

Regarding phase difference detection between signals, detecting a phase difference between signals within a range of $-2\pi$ ($-360$ degrees) to $+2\pi$ ($+360$ degrees) in PLL circuits is well known (see, for example, Japanese Laid-open Patent Publication No. 2004-120515).

Regarding phase adjustment, controlling a phase shift circuit to detect a dynamic range from the output of a loop filter and controlling the dynamic range of the loop filter output to stay within a certain range is well known. Moreover, when an operating point moves to an end of the dynamic range, resetting to the middle point of the dynamic range is well known (see, for example, Japanese Laid-open Patent Publication No. 09-009285).

However, even if the range of the phase difference detection between signals is set to a wide range of, for example, approximately 0 to 360 degrees, the detected phase difference varies greatly if fluctuation of the detected phase difference occurs in the phase control target. For example, if the detected phase difference varies between +180 degrees and −180 degrees, the level output indicating the detected phase difference will vary greatly. When filtered, a level output with this amount of variation will become a phase difference output approaching the middle level of the output, e.g., a phase difference output with a phase difference of 0 degrees, despite the large variation in the phase difference output. It may be difficult to perform phase control in response to a varying phase difference with the above type of phase difference output.

SUMMARY

According to an aspect of the invention, a method used by a phase difference detection circuit for detecting a phase difference between two signals includes shifting a detected phase difference between the two signals by an offset value, outputting the detected phase difference, and controlling the offset value such that the outputted detected phase difference falls within a phase difference range between a lower limit and an upper limit.

The object and advantages of the invention will be realized and attained by means of the elements and combinations particularly pointed out in the claims.

It is to be understood that both the foregoing general description and the following detailed description are example of and explanatory and are not restrictive of the invention, as claimed.

BRIEF DESCRIPTION OF DRAWINGS

FIG. 7 illustrates an exclusive OR logic gate truth table.

FIGS. 8A to 83 are time charts illustrating phase difference detector operations.

FIGS. 10A to 10D are timing charts illustrating output determination unit operations.

FIG. 11 illustrates an exclusive OR logic gate truth table of an output determination unit.

FIGS. 20A to 20C illustrate fluctuations of detected phase differences.

DESCRIPTION OF EMBODIMENTS

First Embodiment

Figure 1:
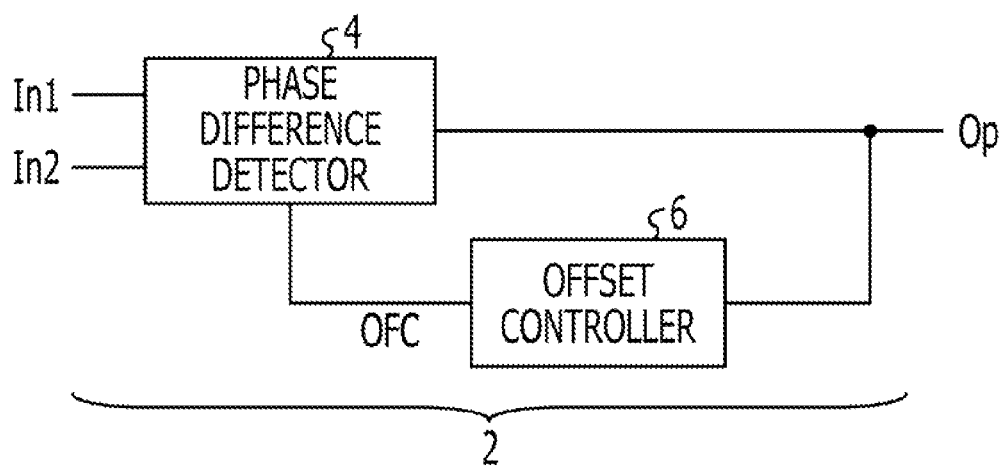
FIG. 1 illustrates a phase difference detection circuit according to a first embodiment.

A first embodiment will be described with reference to FIG. 1. The phase difference detection circuit illustrated in FIG. 1 is merely an example and the present invention is not limited to such a configuration.

A phase difference detection circuit 2 is an example of the phase difference detection circuit disclosed herein. The phase difference detection circuit 2 illustrated in FIG. 1 includes a phase difference detector 4 and an offset controller 6. The phase detector 4 and the offset controller 6 may be implemented as digital circuits or processors, e.g., Digital Signal Processors (DSP), respectively.

The phase difference detector 4 is an example of a phase detector for detecting a phase difference between two signals. A signal input In1 is an example of a first signal that is one of the abovementioned two signals. A signal input In2 is an example of a second signal that is the other one of the abovementioned two signals.

The phase difference detector 4 realizes a phase difference detection function and an offset function. The phase difference detection function, for example, detects a phase difference within a wide range of 0 to 720 degrees. The phase difference between the signal inputs In1 and In2 is detected by the phase difference detection function. As a result, a phase difference output Op that represents a detected phase difference DP is obtained. The phase difference output Op is an electric signal that indicates the detected phase difference DP. The phase difference output Op is applied to the output of the offset controller 6.

The offset function is a function for shifting the detected phase difference between the signal inputs In1 and In2 with an offset value, and then outputting the shifted detected phase difference. The example of offset function adds or subtracts an offset value to shift the detected phase difference to fall within a certain range while maintaining the wide range phase difference detection function. Specifically, the abovementioned addition or subtraction of the offset value is carried out with an offset control signal OFC from the offset controller 6.

The offset controller 6 is an example of a controller for controlling the abovementioned offset value. The offset controller 6 controls the abovementioned offset value such that the detected phase difference DP is not lower than a certain lower limit $P_L$ nor higher than a certain upper limit $P_H$, based on the phase difference output Op. To perform the abovementioned control, the offset controller 6 determines whether the detected phase difference DP has reached the upper limit $P_H$ or the lower limit $P_L$ based on the phase difference output Op. If the detected phase difference DP reaches the upper limit $P_H$ or the lower limit $P_L$, the offset control signal OFC is obtained from the offset controller 6. The upper limit $P_H$ and the lower limit $P_L$ are set to be within a range of possible phase difference detection by the phase difference detector 4. The upper limit $P_H$ is a value that is smaller than the upper end of the phase difference range. The lower limit $P_L$ is a value that is higher than the lower end of the phase difference range.

The following phase difference detection and detection control is conducted with the above configuration. Phase detection is conducted with offset values of +OF and −OF in the phase difference detector 4. If the detected phase difference DP reaches the upper limit $P_H$ or the lower limit $P_L$, the offset control signal OFC is outputted from the offset controller 6. The offset control signal OFC may be a continuous signal or a transient signal outputted when the detected phase difference DP reaches the upper limit $P_H$ or the lower limit $P_L$.

In this case, the offset value +OF is changed to the offset value −OF if the detected phase difference DP reaches the upper limit $P_H$ or the lower limit $P_L$ with the offset value +OF. The current offset value is changed to the offset value +OF if the offset value is −OF at the time point when the detected phase difference DP reaches one of the limits. Specifically, the detected phase difference DP is controlled to be within the phase difference range equal to or higher than the lower limit $P_L$ or equal to or lower than the upper limit $P_H$ by adding or subtracting the offset value according to the detected phase difference DP.

Figure 2:
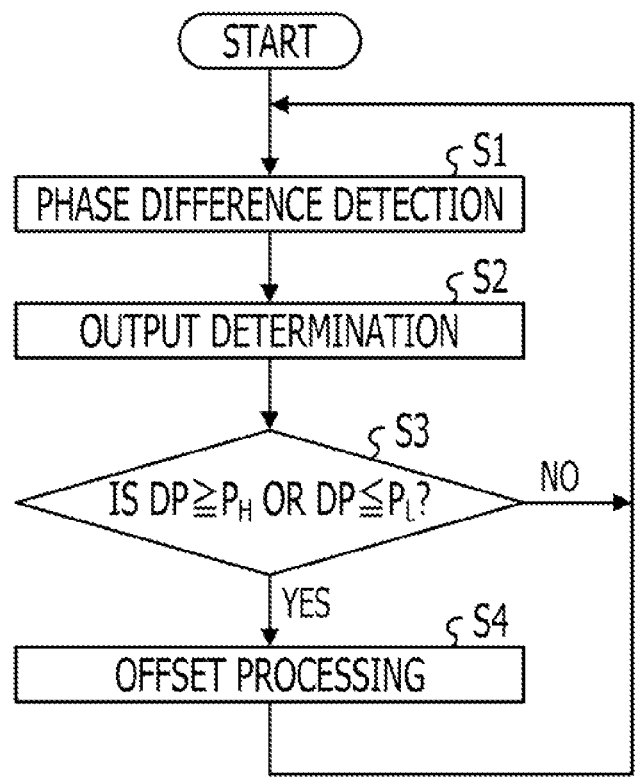
FIG. 2 is a flowchart illustrating detected phase difference control operations.

The phase difference detection and control is described with reference to FIG. 2. The procedures illustrated in FIG. 2 are merely examples and the present invention is not limited to such procedures.

The following operating procedures represent an example of a phase difference detection method disclosed herein. The procedures illustrated in FIG. 2 include phase difference detection (operation 51), output determination (operations S2 and S3), and offset processing (operation S4).

The phase difference detection (operation 51) is a process for detecting a phase difference between at least two signals. The processing is conducted by the phase difference detector 4. As an example of the abovementioned two signals, the signal input In2 and the signal input In2 are applied to the phase difference detector 4. The phase difference between the signal inputs In2 and In2 is detected by the abovementioned phase difference detection function in the phase difference detector 4. The phase difference output Op that indicates the detected phase difference DP is obtained in this process.

Whether the detected phase difference DP reaches the upper limit $P_H$ or the lower limit $P_L$ is determined with the detection determination operations (operations S2 and S3). The output determination involves determining whether the detected phase difference DP has reached or exceeded the upper limit ($DP \geq P_H$) or the lower limit ($DP \leq P_L$) (operation S3). When the detected phase difference DP reaches or exceeds the upper limit ($DP \leq P_H$) or the lower limit ($DP \leq P_L$) (operation S3: YES), the processing switches to the offset processing (operation S4).

The offset processing (operation S4) involves adding or subtracting the abovementioned offset value OF in relation to the phase difference detector 4. When the detected phase difference DP reaches or exceeds the upper limit ($DP \geq P_H$) or the lower limit ($DP \leq P_L$), the offset value OF is subtracted (or added) to shift the detected phase difference DP to be within the abovementioned phase difference range. For example, at the time point when the detected phase difference DP reaches the upper limit $P_H$, an offset value set at +OF is changed to −OF. Conversely, if the set offset value is −OF, the offset value is changed to the offset value +OF based on a reset signal RESET.

After the offset processing, the process returns to the phase difference detection (operation 51) and the phase difference detection is conducted again in the same way. If the detected phase difference DP does not reach or exceed the upper limit ($DP \geq P_H$) or the lower limit ($DP \leq P_L$) (operation S3: NO) in operation S3 (output determination), the processing does not switch to the offset processing (operation S4) and instead returns to operation S1. Specifically, if the detected phase difference DP is within a detectable phase difference range Pr ($P_L < DP < P_H$), the current offset value is maintained.

The above type of phase difference detection has the following advantages.

(1) Continuous phase difference output characteristics may be obtained by the phase difference detection.

Figure 3:
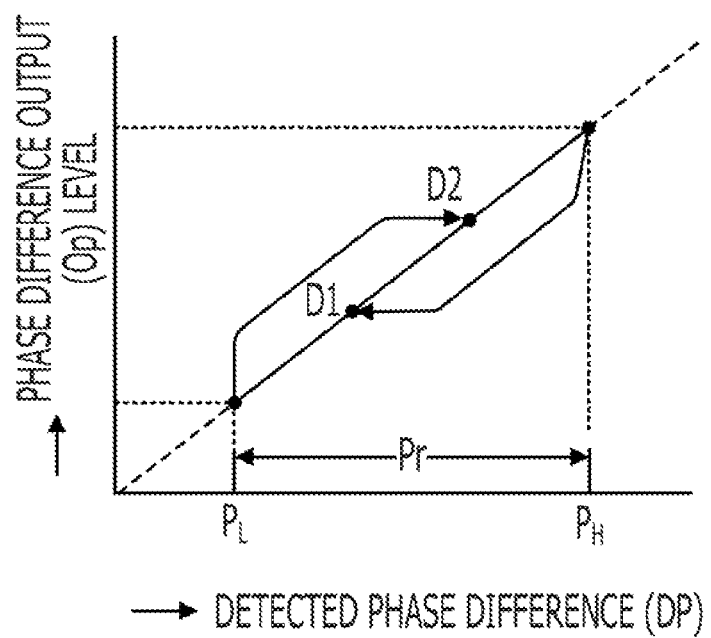
FIG. 3 illustrates phase difference output characteristics.

The phase difference output characteristics are described with reference to FIG. 3. The phase difference output characteristics illustrated in FIG. 3 represent a detected phase difference (horizontal axis) versus a phase difference output level (vertical axis). A linear phase difference output level may be obtained in relation to the detected phase difference DP. When the detected phase difference DP reaches the upper limit $P_H$, the detected phase difference DP is shifted to a phase difference D1 by adding or subtracting the abovementioned offset value OF. Moreover, when the detected phase difference DP reaches the lower limit $P_L$, the detected phase difference DP is shifted to a phase difference D2 by adding or subtracting the abovementioned offset value OF. Specifically, the detected phase difference DP is shifted by a certain phase difference D1 (e.g., shift amount=$P_H$−D1) when the detected phase difference DP reaches the upper limit $P_H$, or shifted by a certain phase difference D2 (>D1) (e.g., shift amount=$P_H$+D2) when the detected phase difference DP reaches the lower limit $P_L$. As a result, continuous phase difference output characteristics may be obtained for all phase differences since the detected phase difference is only increased or decreased by a certain phase difference.

(2) Shifting the detected phase difference DP to be within the phase difference range Pr may be conducted with an offset value set to any value around 360 degrees for example.

(3) A phase detectable range for the phase difference detection function of the phase difference detector 4 may exceed the abovementioned phase difference range Pr and be any value. A continuous phase difference detection output may be obtained in such a detectable range.

Second Embodiment

Figure 4:
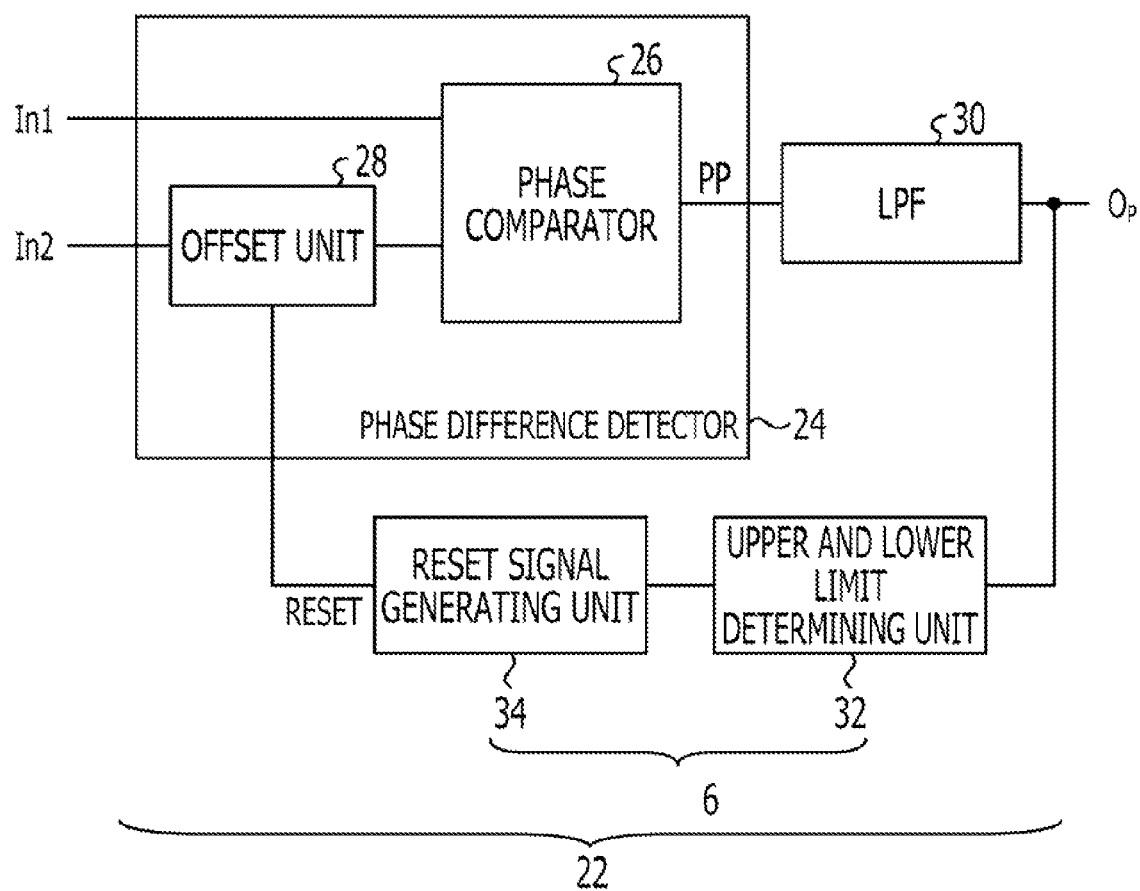
FIG. 4 illustrates a phase difference detection circuit according to a second embodiment.

A second embodiment is described with reference to FIG. 4. The phase difference detection circuit illustrated in FIG. 4 is merely an example and the present invention is not limited to such a configuration. Parts that are the same as parts in FIG. 1 are given the same reference numerals in FIG. 4.

A phase difference detection circuit 22 is an example of the phase difference detection circuit disclosed herein. The phase difference detection circuit 22 includes a function to detect a phase difference of, for example, 0 to 720 degrees, and determines the upper limit $P_H$ and the lower limit $P_L$ of the detected phase difference DP. If the detected phase difference DP value reaches the upper limit $P_H$ or the lower limit $P_L$, only 360 degrees is added or subtracted such that continuous phase difference output characteristics of all the phase differences are realized.

A phase difference detector 24 of the phase difference detection circuit 22 illustrated in FIG. 4 is an example of a phase detector for detecting the phase difference between signals, and includes a phase comparator 26 and an offset unit 28. The phase difference detection circuit 22 may be implemented as digital circuits or processors, e.g., Digital Signal Processors (DSP). The signal inputs In2 and In2 are applied as examples of two signals that are phase difference detection targets, to the phase difference detector 24. A low-pass filter (LPF) 30 is provided on the output side of the phase difference detector 24. An upper and lower limit determining unit 32 and a reset signal generating unit 34 are provided in the offset controller 6.

The phase comparator 26 realizes a function for detecting a phase difference within a phase difference range of, for example, 0 to 720 degrees. The signal input In2 is inputted into the phase comparator 26, and the signal input In2 is inputted into the phase comparator 26 through the offset unit 28. The offset unit 28 is provided at the signal input In2 side where the signal input In2 that is one of the two signals is inputted. The offset unit 28 sets the abovementioned offset value according to the signal input In2. The phase comparator 26 compares the signal input In2, which is used for setting the offset value, with the signal input In2, and detects the phase difference of the two signal inputs in a range of 0 to 720 degrees. Thus, a phase difference pulse PP that indicates the detected phase difference DP is obtained in the phase comparator 26. The pulse width of the phase difference pulse PP indicates the magnitude of the detected phase difference DP.

The LPF 30 is an example of a signal converter for converting the phase difference pulse PP to a direct current level. The abovementioned phase difference output Op that represents the phase difference pulse PP converted to the direct current level in the LPF 30 is obtained. The phase difference output Op is a signal having a level proportional to the magnitude of the detected phase difference DP. The phase difference output Op is inputted into the upper and lower limit determining unit 32.

The upper and lower limit determining unit 32 is an example of an output level determining unit for determining whether the detected phase difference DP has reached the upper limit or the lower limit. An upper limit Vth-HI and a lower limit Vth-LO are previously set as reference values in the upper and lower limit determining unit 32. The upper limit Vth-HI and the lower limit Vth-LO are direct current voltage values for comparing with the phase difference output Op. A determination result is obtained when the phase difference output Op reaches the upper limit Vth-HI or the lower limit Vth-LO. The determination result is inputted into the reset signal generating unit 34.

The reset signal generating unit 34 generates the reset signal RESET based on the determination result from the upper and lower limit determining unit 32. The reset signal RESET is inputted into the offset unit 28 of the phase difference detector 24.

In such a configuration, offset processing is conducted when the reset signal RESET is applied to the offset unit 28. Specifically, the offset value set before the reset signal RESET is inputted is changed to a new offset value after receiving the reset signal RESET. Based on the change of the offset value, 180 degrees, for example, is added or subtracted as an offset value from the state of the offset value before the reset signal RESET is inputted (below-mentioned pulse inversion). As a result, no matter what the value is of the signal input In1 and In2 phase difference, the phase difference output Op of the phase difference detection circuit 22 is continuously changed.

The phase difference output characteristics of the phase difference detection circuit 22 are described with reference to FIG. 5. The phase difference output characteristics illustrated in FIG. 5 are merely examples and the present invention is not limited to such characteristics.

Figure 5:
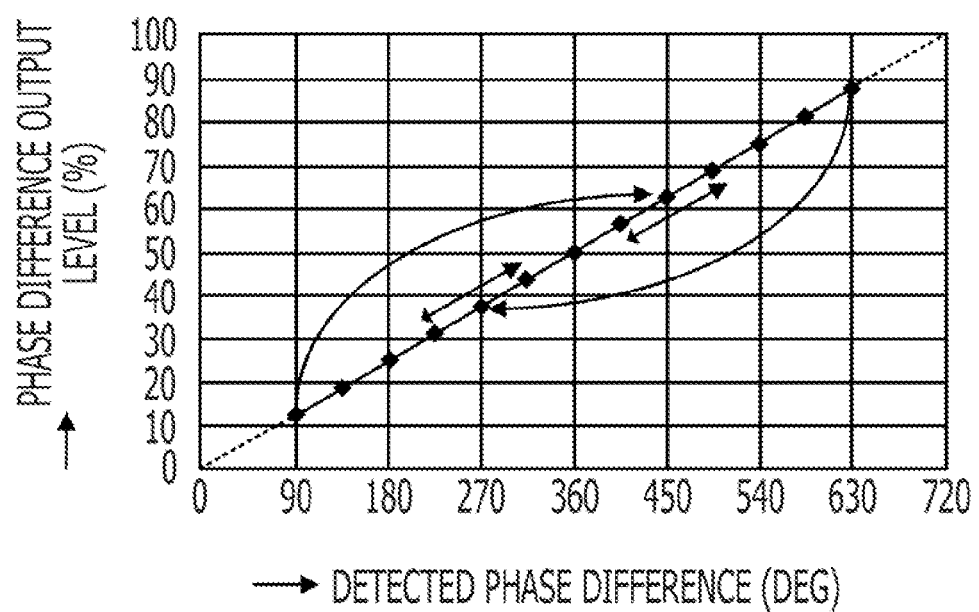
FIG. 5 illustrates phase difference output characteristics.

As an example, FIG. 5 illustrates phase difference output characteristics in which the upper limit $P_H$ and the lower limit $P_L$ of the detected phase difference DP are set to 630 degrees and 90 degrees respectively. The horizontal axis indicates the detected phase difference DP (degrees) and the vertical axis indicates the phase difference output levels (%). The output characteristics indicate changes in the phase difference output levels in response to the detected phase difference DP. In FIG. 5, the curved arrows indicate the phase shift and the two-way arrows indicate the phase difference changes.

When the detected phase difference DP reaches a phase difference output Op (output voltage) that exceeds 630 degrees, the reset signal RESET is generated in the reset signal generating unit 34. As a result, the detected phase difference DP is shifted −360 degrees to become 270 degrees. In this case, the detected phase difference DP is adjusted over 270 degrees.

Similarly, when the detected phase difference DP reaches 90 degrees, the reset signal RESET is generated in the reset signal generating unit 34. The reset signal RESET is an example of a control signal for switching the offset value, and the reset signal generating unit 34 is an example of a control signal generating unit. As a result, the detected phase difference DP is shifted +360 degrees to become 450 degrees. In this case, the detected phase difference DP is adjusted to 450 degrees.

Third Embodiment

Figure 6:
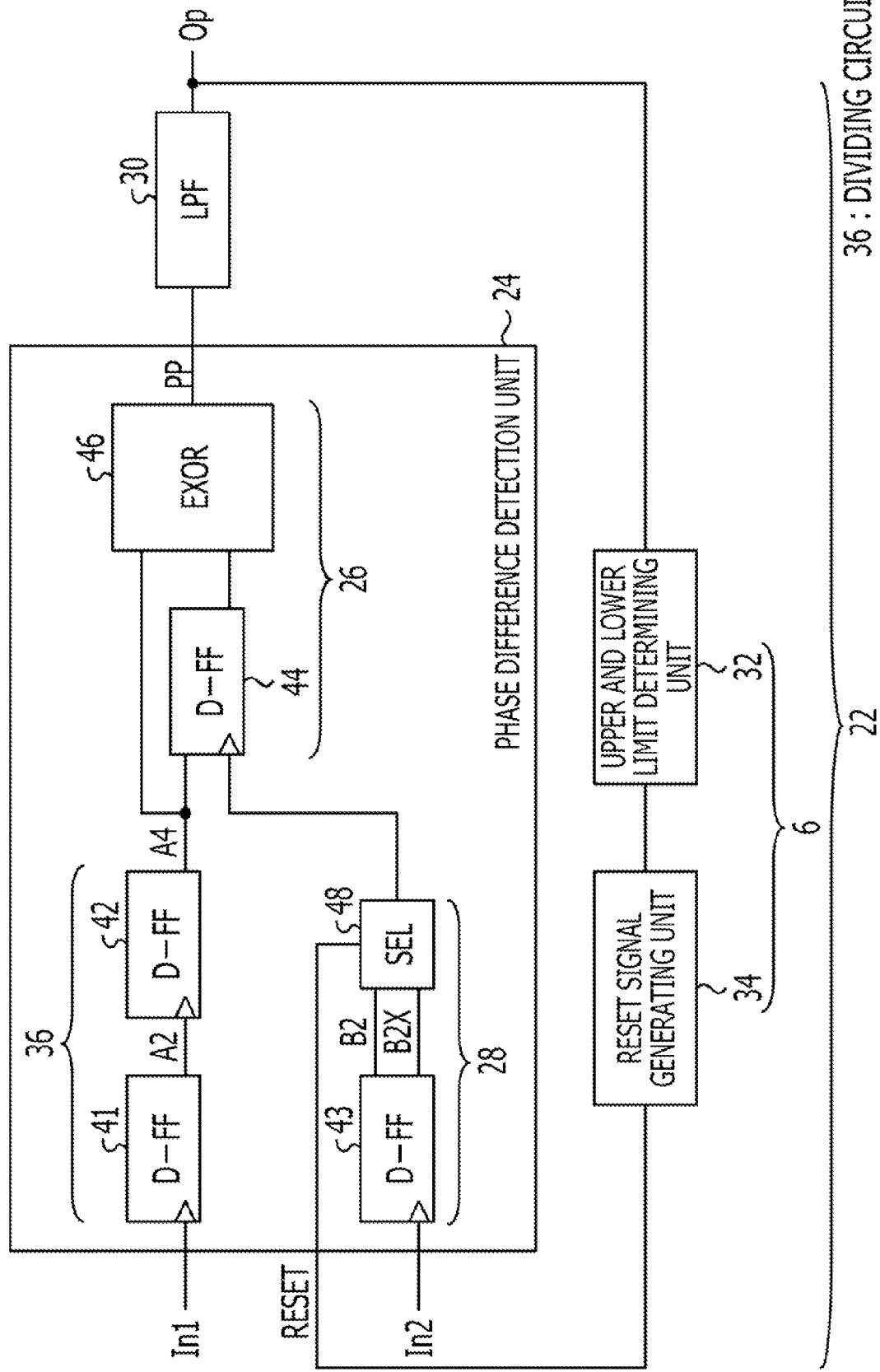
FIG. 6 illustrates a phase difference detection circuit according to a third embodiment.

A third embodiment will be described with reference to FIG. 6. The phase difference detection circuit 22 illustrated in FIG. 6 is merely an example and the present invention is not limited to such a configuration. Parts that are the same as parts in FIG. 4 are given the same reference numerals in FIG. 6.

In the phase difference detector 24 of the phase difference detection circuit 22 illustrated in FIG. 6, the signal input In1 is set to a phase difference detection reference (master) side, and the signal input In2 is set to a slave side. A dividing circuit 36 provided on the signal input In1 side is provided with example of D-shaped flip-flops (D-FF) 41 and 42. The signal input In1 is inputted as a clock to the D-FF 41 and is frequency-divided in two by the D-FF 41. An output A2 of the D-FF 41 is inputted as a clock into the D-FF 42 and frequency-divided in two by the D-FF 42. As a result, an output A4 from the signal input In1 is frequency-divided in four by the dividing circuit 36. The frequency-divided output A4 is inputted into a D-FF 44 and an exclusive OR (EXOR) logic gate 46 provided in the phase comparator 26.

The offset unit 28 is provided on the signal input In2 side. The offset unit 28 includes a D-FF 43 and a selector circuit (SEL) 48 as examples. The D-FF 43 is an example of a frequency dividing unit. The signal input In2 is inputted as a clock to the D-FF 43 and frequency-divided into two by the D-FF 43. The D-FF 43 includes a non-inverting output B2 and an inverting output B2X. The SEL 48 is an example of a selector for selecting the non-inverting output B2 or the inverting output B2X. The SEL 48 outputs the non-inverting output B2 or the inverting output B2X based on the received reset signal RESET. For example, when the reset signal RESET=H, the non-inverting output B2 is switched to the inverting output B2X. Conversely, when the reset signal RESET=L, the inverting output B2X is switched to the non-inverting output B2. The non-inverting output B2 and the inverting output B2X are applied as CLK inputs to the D-FF 44 of the phase comparator 26.

The phase comparator 26 includes the example of D-FF 44 and the EXOR logic gate 46. The D-FF 44 receives the inverting output B2X and the non-inverting output B2 of the D-FF 43 as clock inputs. Therefore, the output of the D-FF 42 is gated by the inverting output B2X or the non-inverting output B2 in the D-FF 44. The D-FF 42 output A4 and the D-FF 44 output are then applied to the EXOR logic gate 46. Thus, the phase difference of the signal input In2 with reference to the signal input In2 is detected, and the phase difference pulse PP indicating the detected phase difference DP is obtained in the EXOR logic gate 46.

The outputs of the D-FF 42 and D-FF 44 and the output of the EXOR logic gate 46 are described with reference to FIG. 7. FIG. 7 illustrates a truth table of the EXOR logic gate 46. When the D-FF 42 and D-FF 44 outputs are both L (low level) or both H (high level), the output of the EXOR logic gate 46 becomes an L output based on the exclusive logical sum of both of the D-FF 42 and D-FF 44 outputs. When one of the D-FF 42 or D-FF 44 outputs is an L output and the other one is an H output, the output of the EXOR logic gate 46 becomes an H output based on the exclusive logical sum of both of the D-FF 42 and D-FF 44 outputs. In other words, the H output interval of the EXOR logic gate 46 indicates the detected phase difference DP.

Figure 8:
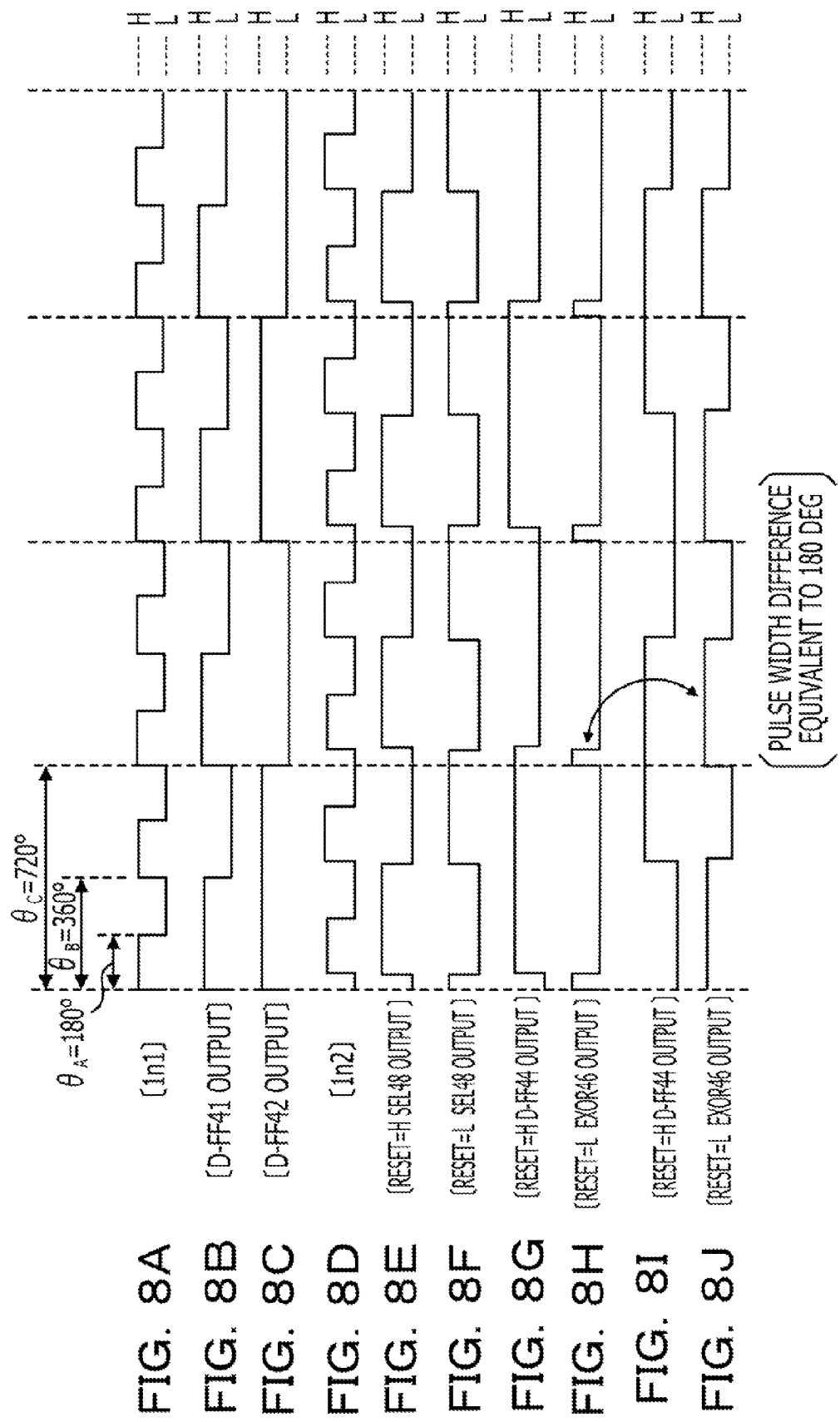

The logic operation of the phase difference detector 24 is described with reference to FIGS. 8A to 83. The time charts illustrated in FIGS. 8A to 83 illustrate the logic operations of each unit of the phase difference detector 24. However, the present invention is not limited to such logic operations.

FIG. 8A indicates signal input In2 and FIG. 8D indicates signal input Int. In this example, the one-cycle sections of the signal inputs In2 and In2 are set to $\theta_B=360$ degrees, the H output intervals are set to $\theta_A=180$ degrees, and the L output intervals are set to 180 degrees. Thus, the two-cycle sections of the signal inputs In2 and In2 are $\theta_C=720$ degrees.

The output A2 illustrated in FIG. 8B is obtained in the D-FF 41 that receives the signal input In2 as a clock. One cycle of the output A2 is $\theta_C=720$ degrees and the H output interval of the output A2 is $\theta_B=360$ degrees and the L output interval is 360 degrees. The output A4 illustrated as FIG. 8C is obtained in the D-FF 42 that receives the output A2 as a clock. One cycle of the output A4 is 1440 degrees and the H output interval of the output A4 is $\theta_B=720$ degrees and the L output interval is 720 degrees.

The non-inverting output B2 and the inverting output B2X having cycles of 720 degrees are obtained in the D-FF 43 that receives the signal input Int as a clock. If the reset signal RESET is RESET=H, the non-inverting output B2 is selected by the SEL 48 as indicated by FIG. 8E. If the reset signal RESET is RESET=L, the inverting output B2X is selected by the SEL 48 as indicated by FIG. 8F. Specifically, when the reset signal RESET is switched between H and L, the SEL 48 output is switched to be the non-inverting output B2 or the inverting output B2X.

When RESET=H, the output A4 is gated by the non-inverting output B2 in the D-FF 44, and the output indicated by FIG. 8G is obtained. The output (phase difference pulse PP) indicated as FIG. 8H is obtained based on the exclusive logic sum (one output is H and the other output is L) of the output A4 and the D-FF 44 output in the EXOR logic gate 46.

When RESET=L, the output A4 is gated by the inverting output B2X in the D-FF 44, and the output indicated as FIG. 8I is obtained. The output (phase difference pulse PP) indicated as FIG. 83 is obtained based on the exclusive logic sum (one output is H and the other output is L) of the output A4 and the D-FF 44 output in the EXOR logic gate 46. In this case, the H output interval of the phase difference pulse PP indicated as FIG. 8H and FIG. 83 is a pulse width difference equivalent to 180 degrees.

Figure 9:
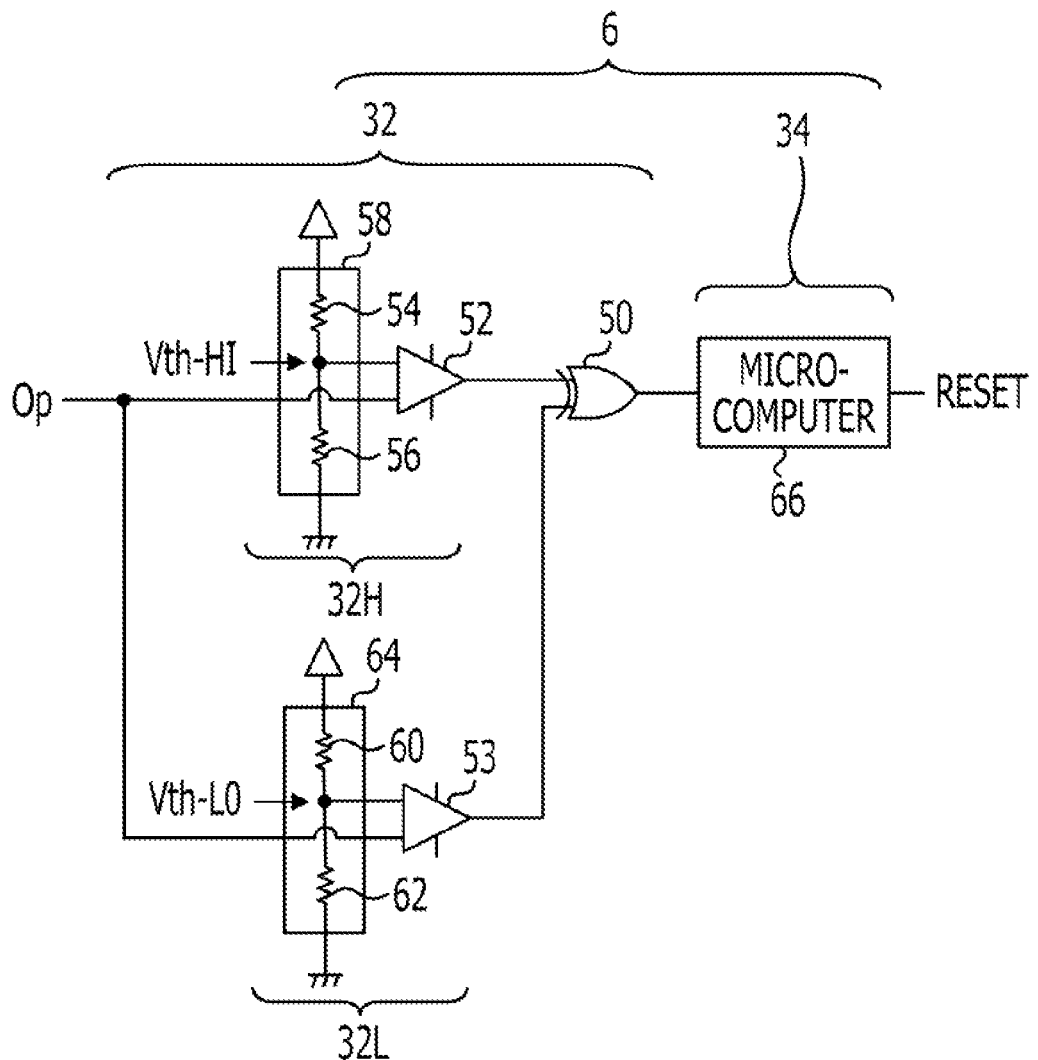
FIG. 9 illustrates examples of an output determination unit and a reset signal generating unit.

Next, the upper and lower limit determining unit 32 and the reset signal generating unit 34 and their operations will be described with reference to FIGS. 9, 10A to 10D, and 11. FIG. 9 illustrates configuration examples of the upper and lower limit determining unit 32 and the reset signal generating unit 34. FIGS. 10A to 10D illustrate operations of the upper and lower limit determining unit 32. FIG. 11 illustrates an EXOR logic gate truth table of the upper and lower limit determining unit 32. The present invention is not limited to such configurations and operations. Parts that are the same as parts in FIG. 4 are given the same reference numerals in FIG. 9.

The upper and lower limit determining unit 32 illustrated in FIG. 9 includes an upper limit determining unit 32H, a lower limit determining unit 32L, and an EXOR logic gate 50. Specifically, the upper and lower limit determining unit 32 is configured as a window comparator that determines whether the detected phase difference is equal to or above an upper limit value or equal to or lower than a lower limit value.

The upper limit determining unit 32H is provided with a comparator 52, and the lower limit determining unit 32L is provided with a comparator 53. An upper limit voltage Vth-HI is set as a reference input in the comparator 52, and a lower limit voltage Vth-LO is set as a reference input in the comparator 53. A voltage divider circuit 58 having resistors 54 and 56 is used to generate the upper limit voltage Vth-HI. In this case, the upper limit voltage Vth-HI is set by dividing direct current voltage with the resistance ratio of the resistors 54 and 56. Additionally, a voltage divider circuit 64 having resistors 60 and 62 is used to generate the lower limit voltage Vth-LO. In this case, the lower limit reference voltage Vth- LO is set by dividing direct current voltage with the resistance ratio of the resistors 60 and 62.

As illustrated in FIG. 10A, the output of the comparator 52 becomes an H output as illustrated in FIG. 10B when the phase difference output Op level is equal to or higher than the upper limit voltage Vth-HI, or becomes an L output when the phase difference output Op level is equal to or lower than the upper limit voltage Vth-HI, in the upper and lower limit determining unit 32. Moreover, the output of the comparator 53 becomes an L output as illustrated in FIG. 10C when the phase difference output Op level is equal to or lower than the lower limit voltage Vth-LO, or becomes an H output when the phase difference output Op level is equal to or higher than the upper limit voltage Vth-LO.

The logic operations of the EXOR logic gate 50 that receives the outputs from the comparators 52 and 53 are described in the truth table illustrated in FIG. 11. As illustrated in FIG. 10D, the EXOR logic gate 50 generates an H output when the H or L outputs of the comparators 52 and 53 differ. Moreover, the EXOR logic gate 50 generates an L output (L output in FIG. 10D) when the H or L outputs of the comparators 52 and 53 match. Specifically, an L output is obtained when the detected phase difference is equal to or lower than the lower limit or equal to or higher than the upper limit, and an H output is obtained when the detected lower limit is equal to or higher than the lower limit or equal to or lower than the upper limit.

The reset signal generating unit 34 provided on the output side of the EXOR logic gate 50 includes an example of microcomputer (UPC) 66. The microcomputer 66 switches the reset signal RESET from the actual output to an inverted value if the EXOR logic gate 50 output, e.g., the upper and lower limit determining unit 32 determination output, is an L output. Specifically, if the actual output is an H output, the output is switched to an inverted L output. If the actual output is L, the output is switched to a non-inverted H level which is the inversion of the L output.

The microcomputer 66 is described with reference to FIG. 12. The configuration of the microcomputer illustrated in FIG. 12 is an example, and the present invention is not limited as such.

Figure 12:
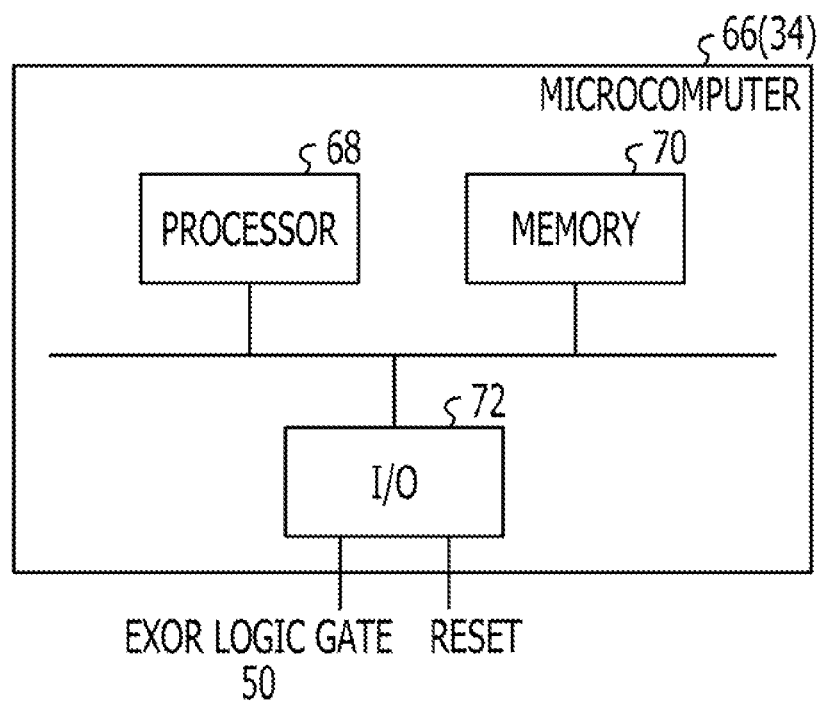
FIG. 12 illustrates an example of a configuration of a reset signal generating unit microcomputer.

The microcomputer 66 illustrated in FIG. 12 includes a processor 68, a memory 70, and an input/output (I/O) unit 72. The memory 70 may include a read-only memory (ROM) that stores programs, and a random-access memory (RAM) that stores data. In such a configuration, the reset signal RESET being outputted is switched from the actual output to the inverted value and then outputted when the EXOR logic gate 50 output is loaded into the I/O 72 and transitions from L to H.

Operations of the phase difference detection circuit 22 (see FIG. 6) of the present embodiment are described with reference to FIGS. 13A to 13H and 14A to 14H. FIGS. 13A to 13H illustrate operations of the process of the LPF 30 output reaching the lower limit voltage Vth-LO. FIGS. 14A to 14H illustrate operations of the process of the LPF 30 output reaching the upper limit voltage Vth-HI.

Figure 13:
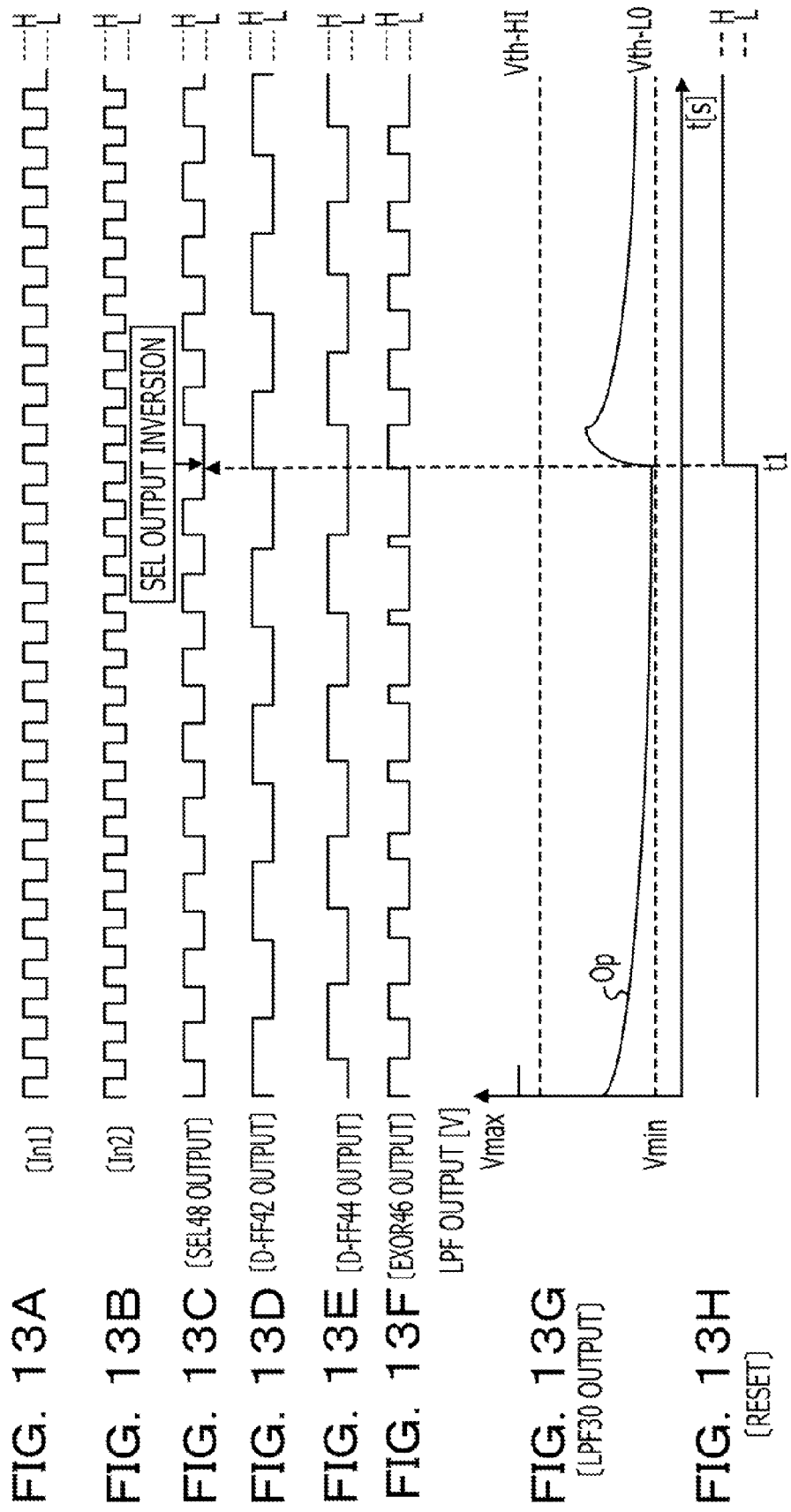
FIGS. 13A to 13H are time charts illustrating phase difference detection circuit operations.

The signal input In2 illustrated in FIG. 13A is frequency-divided into 4 by the dividing circuit 36 as described above such that the output A4 illustrated in FIG. 13D is obtained in the D-FF 42. The signal input In2 illustrated in FIG. 13B is frequency-divided into 2 by the D-FF 43 as described above. If RESET=L, the non-inverting output B2 of the D-FF 43 is selected by the SEL 48 so that the non-inverting output B2 illustrated in FIG. 13C is obtained.

The non-inverting output B2 of the D-FF 43 is applied as the clock in the D-FF 44 so that the D-FF 42 output is gated and the output illustrated in FIG. 13E is obtained. An EXOR logic gate 46 output illustrated in FIG. 13F is obtained from the exclusive logic sum of the output A4 of D-FF 42 and the output of D-FF 44.

In this case, the H section of the output pulse of the EXOR logic gate 46 becomes gradually smaller so that the LPF 30 output gradually decreases as illustrated in FIG. 13G. When the LPF 30 output (phase difference output Op) reaches the lower limit voltage Vth-LO, the EXOR logic gate 50 generates an L output (see FIG. 13D). The microcomputer 66 of the reset signal generating unit 34 generates the reset signal RESET illustrated in FIG. 13H based on the above L output. In this case, if the existing reset signal is RESET=L, the reset signal is switched to the inverted value thereof RESET=H.

The SEL 48 output at that time point is switched from the non-inverting output B2 to the inverting output B2X as illustrated in FIG. 13C at that time point by the transitioning of the reset signal to RESET=H. As a result, the detected phase difference shifts and the LPF 30 output recovers to a high value from the lower limit voltage Vth-LO at and after a time point t1 as illustrated in FIG. 13G.

Figure 14:
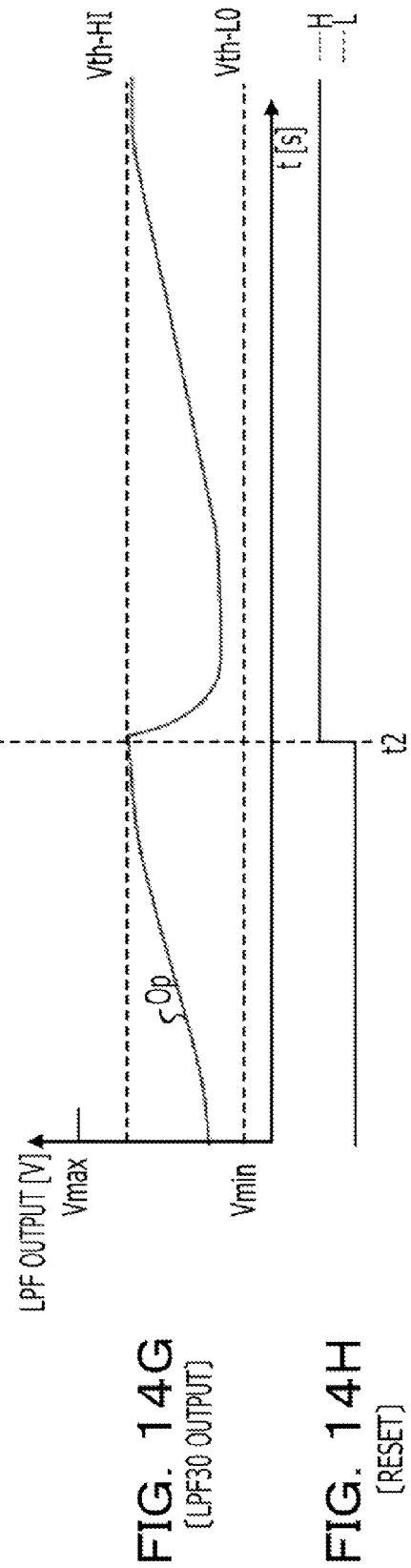
FIGS. 14A to 14H are time charts illustrating phase difference detection circuit operations.

The signal input In1 illustrated in FIG. 14A is similarly frequency-divided into 4 by the dividing circuit 36 thereby obtaining the output A4 illustrated in FIG. 14D from the D-FF 42. Moreover, the signal input Int illustrated in FIG. 14B is frequency-divided into 2. Since the reset signal is RESET=H at this time, the inverting output B2X of the D-FF 43 is selected by the SEL 48 thereby obtaining the inverting output B2X as illustrated in FIG. 14C.

The inverting output B2X of the D-FF 43 is applied to the clock in the D-FF 44 such that the D-FF 42 output is gated and the output illustrated in FIG. 14E is obtained. An EXOR logic gate 46 output illustrated in FIG. 14F is obtained from the exclusive logic sum of the output A4 of D-FF 42 and the output of D-FF 44.

In this case, the H section of the output pulse of the EXOR logic gate 46 becomes gradually larger so that the LPF 30 output gradually increases as illustrated in FIG. 14G. When the LPF 30 output (phase difference output Op) reaches the upper limit voltage Vth-HI, the EXOR logic gate 50 generates an L output (see FIG. 14D). The microcomputer 66 of the reset signal generating unit 34 generates the reset signal RESET illustrated in FIG. 14H based on the above L output. In this case, if the existing reset signal is RESET=H, the reset signal is switched to the inverted value thereof RESET=L.

The SEL 48 output at that time point is switched from the non-inverting output B2 to the inverting output B2X as illustrated in FIG. 14C at that time point by the transitioning of the reset signal to RESET=L. As a result, the detected phase difference shifts and the LPF 30 output recovers to a low value from the upper limit voltage Vth-HI at and after a time point t2 as illustrated in FIG. 14G.

According to the above operations, the detected phase difference is controlled to be within a phase detection range equal to or higher than the lower limit and equal to or lower than the upper limit to allow for continuous phase difference detection even if the detected phase difference is less than the lower limit or higher than the upper limit.

Examples of advantages and features of the abovementioned third embodiment are described below.

(1) Including a phase difference detection function of, for example, 0 to 720 degrees and determining when the detected phase difference reaches the upper limit or the lower limit allows for adjusting the phase difference detection value by, for example, only 180 degrees as a constant phase difference. As a result, continuous phase difference output properties may be realized for any phase difference of the signal inputs. Therefore, a continuous output may be obtained even if the input phase difference of two signals for detecting the phase difference is any value from 0 to 360 degrees.

(2) The abovementioned phase difference detection circuit 22 includes a configuration for adjusting a 0-degree to 720-degree phase difference and a phase difference detection value at the upper and lower limits of a phase difference detection range by only 180 degrees.

(3) The phase difference detection circuit 22 implements the processing of adjusting the phase difference detection value at the upper and lower limits by only 180 degrees with a configuration that includes the LPF 30 output that converts a pulse signal corresponding to the detected phase difference to a direct current signal, the comparator 52, and the comparator 53.

(4) The phase difference detection circuit 22 includes a configuration that switches between an inverted output and a non-inverted output of the D-FF 43 with the reset signal RESET generated by the reset signal generating unit 34 in the processing of adjusting the phase difference detection value at the upper and lower limits by only 180 degrees.

(5) A phase difference is detected in the phase difference detection of two signals by using the frequency-divided outputs of the D-FF 41 and the D-FF 42 that frequency-divide one of the signals on the signal input In2 side, and the frequency-divided output (inverted output and non-inverted output) of the one D-FF 43 that frequency-divides the other one of the signals on the signal input In2 side.

(6) The D-FF 44 and the EXOR logic gate 46 are used in the phase difference detection. The frequency-divided output of the D-FF 42 is gated by the inverted output and the non-inverted output of the D-FF 43 in the D-FF 44, thereby converting the detected phase difference to a pulse width in the EXOR logic gate 46 with the exclusive logic sum of the D-FF 42 output and the D-FF 44 output, and then outputting the pulse width.

(7) The reset signal RESET is generated when the output value of the upper and lower limit determining unit 32 becomes H by using the microcomputer 66 in the example of reset signal generating unit 34. If the actual output is RESET=H, the reset signal RESET is switched to the inverted value thereof when the output value of the upper and lower limit determining unit 32 becomes H. In short, the actual output is switched to RESET=L if RESET=H. As a result, continuous detection outputs of the phase difference may be obtained.

Fourth Embodiment

A fourth embodiment will be described with reference to FIG. 15. A microwave power transmission device illustrated in FIG. 15 is merely an example and the present invention is not limited to such a configuration.

Figure 15:
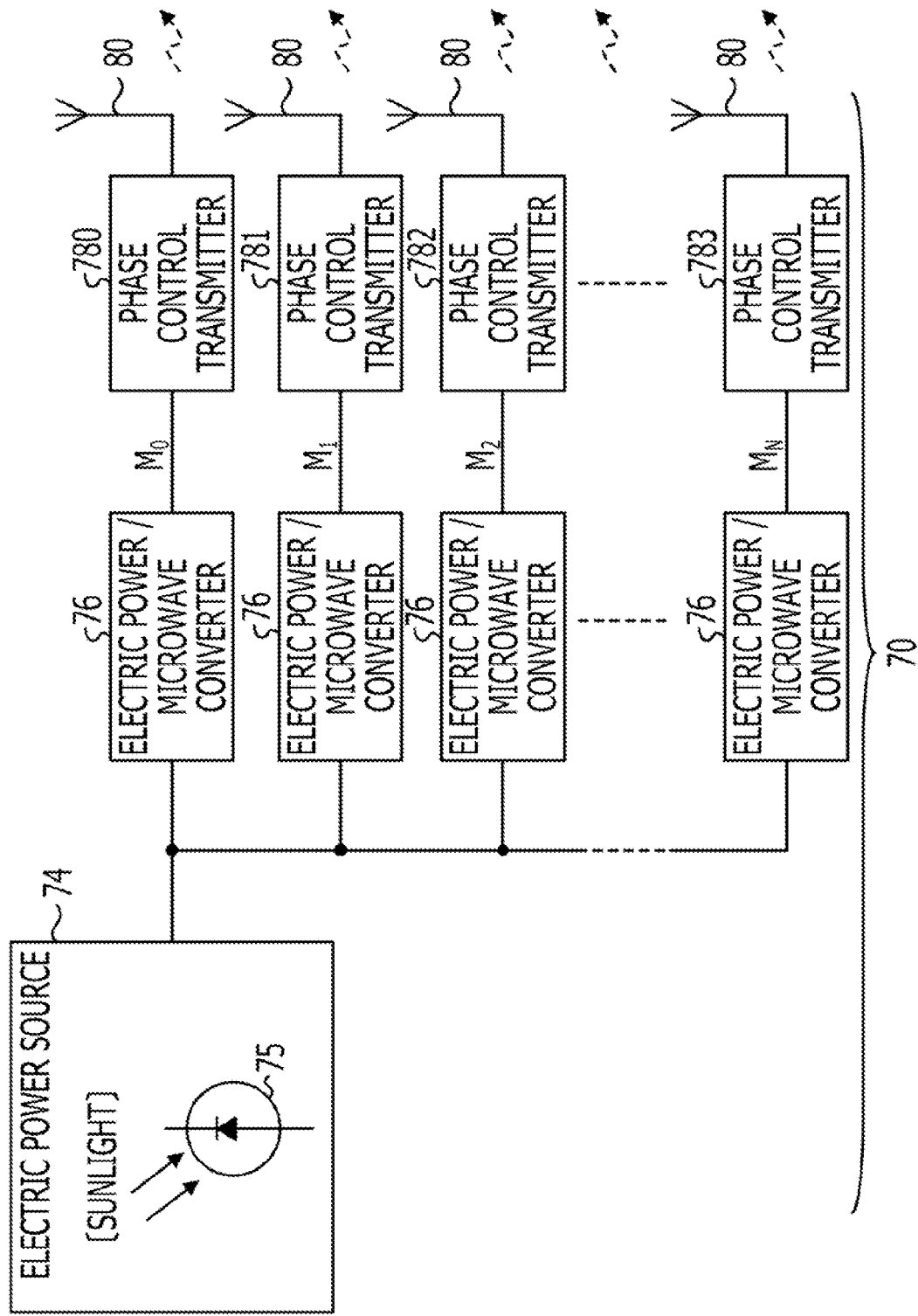
FIG. 15 illustrates a microwave power transmission device according to a fourth embodiment.

A microwave power transmission device 70 illustrated in FIG. 15 is an example of a wireless power transmission device disclosed herein, and transmits space photovoltaic power generation output by microwaves. The microwave power transmission device 70 is provided with an electric power source 74. The electric power source 74 uses an example of solar battery 75. The solar battery 75 generates electric power from sunlight. The electric power source 74 may be provided, for example, in space or on the Earth.

A plurality of electric power/microwave converters 76 is provided at the output side of the electric power source 74. Phase control transmitters 780, 781, 782, . . . 78N are separately provided at the output sides of the electric power/microwave converters 76. The electric power/microwave converters 76 convert electric power to microwaves with a frequency of approximately 6 GHz as an example of transmittable wireless signals. The phase control transmitters 780, 781, 782, . . . 78N are examples of a phase control method and phase controllers disclosed herein.

The electric power obtained by the electric power source 74 is converted to microwaves $M_0, M_1, M_2, M_3, \ldots M_N$ by the electric power/microwave converters 76, and the microwaves $M_0, M_1, M_2, M_3, \ldots M_N$ are applied to the phase control transmitters 780, 781, 782, . . . 78N. While transmitting the microwave outputs from the electric power/microwave converters 76, the phase control transmitters 780, 781, 782, . . . 78N control the microwave output phase to be any value so that the electric power transmission efficiency is optimized. The microwave outputs whose output phases are controlled are separately transmitted to electric power receiving targets from antennas 80.

Figure 16:
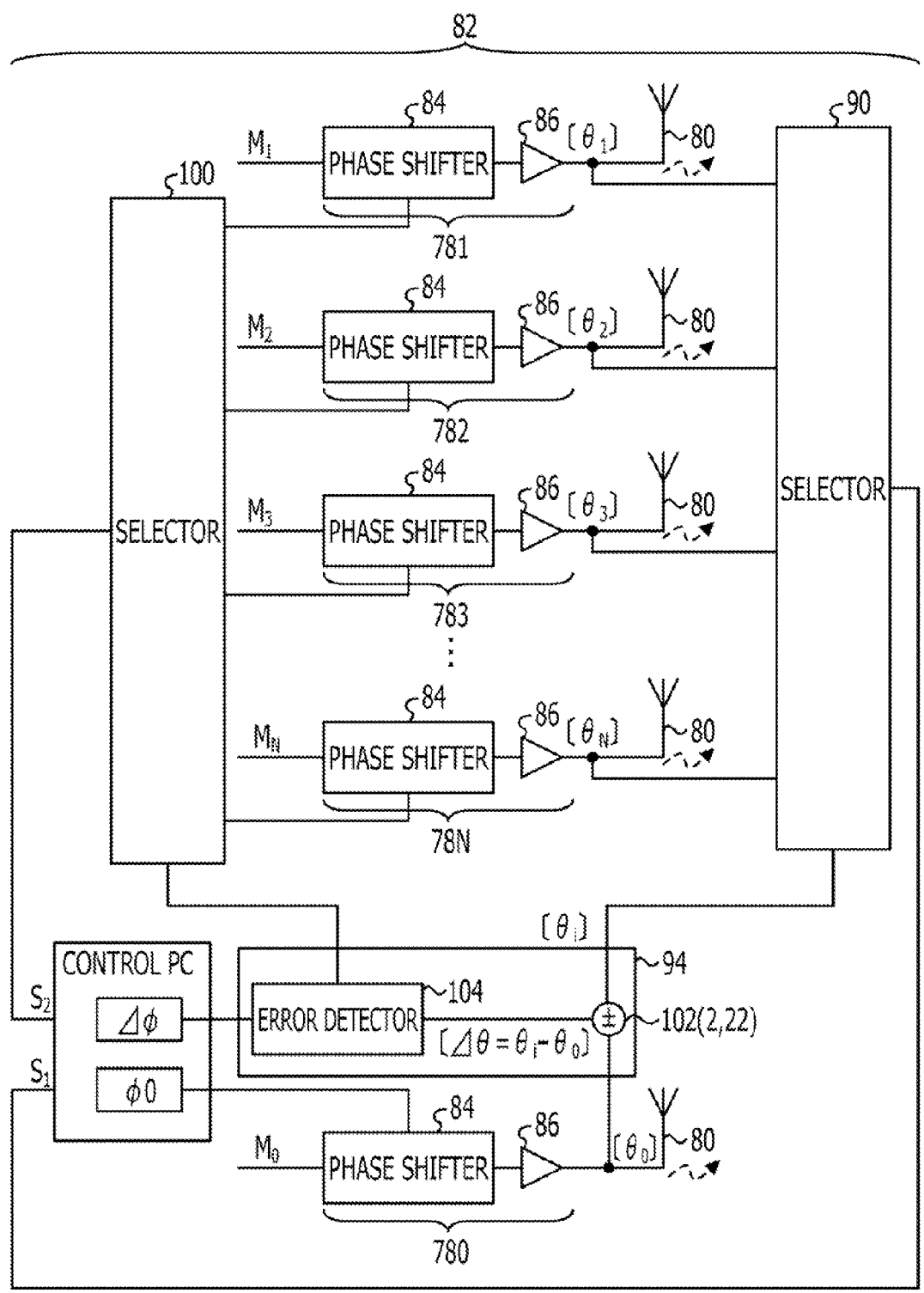
FIG. 16 is a circuit diagram illustrating an example of a configuration of a phase controller.

A phase controller of the microwave power transmission device 70 will be described with reference to FIG. 16. The phase difference detection circuit illustrated in FIG. 16 is merely an example and the present invention is not limited to such a configuration. Parts that are the same as parts in FIG. 15 are given the same reference numerals in FIG. 16.

A phase controller 82 illustrated in FIG. 16 is an example of the phase control method and the phase controller disclosed herein. The phase controller 82 configures a phase difference control feedback system in the abovementioned microwave power transmission device 70. One of the plurality of phase control transmitters 780, 781, 782, . . . 78N, for example the phase control transmitter 780, is set at a reference (master) side, and the other phase control transmitters 780, 781, 782, . . . 78N are set at a slave side of the phase controller 82.

Each of the phase control transmitters 780, 781, 782, . . . 78N are provided with a phase shifter 84 and an amplifier (AMP) 86. Microwaves $M_0, M_2, M_3, \ldots M_N$ are inputted into the respective phase shifters 84 from the abovementioned electric power/microwave converters 76. The AMP 86 is, for example, a final amplifier of the abovementioned phase control transmitters 780, 781, . . . 78N. The antennas 80 are connected to the AMPs 86 for transmitting the abovementioned microwaves. In this embodiment, phases $\theta_0, \theta_1, \theta_2, \theta_3, \ldots \theta_N$ are detected from the signals of the microwaves $M_0, M_1, M_2, M_3, \ldots M_N$ from the AMPs 86. Thus, the AMPs 86 represent an example of a detector for detecting the phases $\theta_0, \theta_1, \theta_2, \theta_3, \ldots \theta_N$.

The phases $\theta_0, \theta_1, \theta_2, \theta_3, \ldots \theta_N$ detected by the AMPs 86 are selected by a first selector 90 and then applied to a phase difference detector 102 in a controller 94. The selector 90 is an example of a selector for selecting the phases $\theta_0, \theta_1, \theta_2, \theta_3, \ldots \theta_N$. The selector 90 is controlled by a selection signal from a control personal computer (control PC) 98 such that some of the phases $\theta_0, \theta_1, \theta_2, \theta_3, \ldots \theta_N$ are selected in order.

The control PC 98 outputs selection signals to the selector 90 and to a second selector 100 concurrently. The control PC 98 outputs a reference phase $\phi 0$ and a target phase difference $\Delta\phi$. The selector 100 selects the slave side phase shifter 84 that is the phase control target.

The controller 94 detects the phase difference $\Delta\theta(=\theta i-\theta_0)$ between the detected phase $\theta_0$ of the reference side AMP 86 and the abovementioned phase $\theta i$ selected by the selector 90. The controller 94 compares the detected phase difference $\Delta\theta$ and the target phase difference $\Delta\phi$, and derives an error. The example of controller 94 includes the phase difference detector 102 and an error detector 104.

The phase difference detector 102 includes the abovementioned phase difference detection circuit 2 (see FIG. 1) or the phase difference detection circuit 22 (see FIG. 4). The phase θi=θ$_1$, for example, is selected from the abovementioned phases θi in the selector 90. A phase output θ$_0$ set to the reference phase φ0 from the reference side AMP 86 is obtained.

The phase θ$_0$ is compared with the phase θ$_1$ to derive the detected phase difference Δθ=θi−θ$_0$=θ$_1$−θ$_0$ in the phase difference detector 102. The detected phase difference Δθ is applied to the error detector 104. The detected phase difference Δθ and the target phase difference Δφ set by the control PC 98 are compared, and a phase difference error is obtained in the error detector 104. The phase difference error is applied to the selector 100 as a phase control signal. Since the selectors 90 and 100 in this case select one control target in relation to the phase output θ$_1$, the phase control signal is applied to the phase shifter 84 that generated the phase θ$_1$ thereby controlling the phase θ$_1$ of the microwave M$_1$. In this case, the phase θ$_1$ is controlled such that the detected phase difference Δθ reaches the target phase difference Δφ set by the control PC 98.

Figure 17:
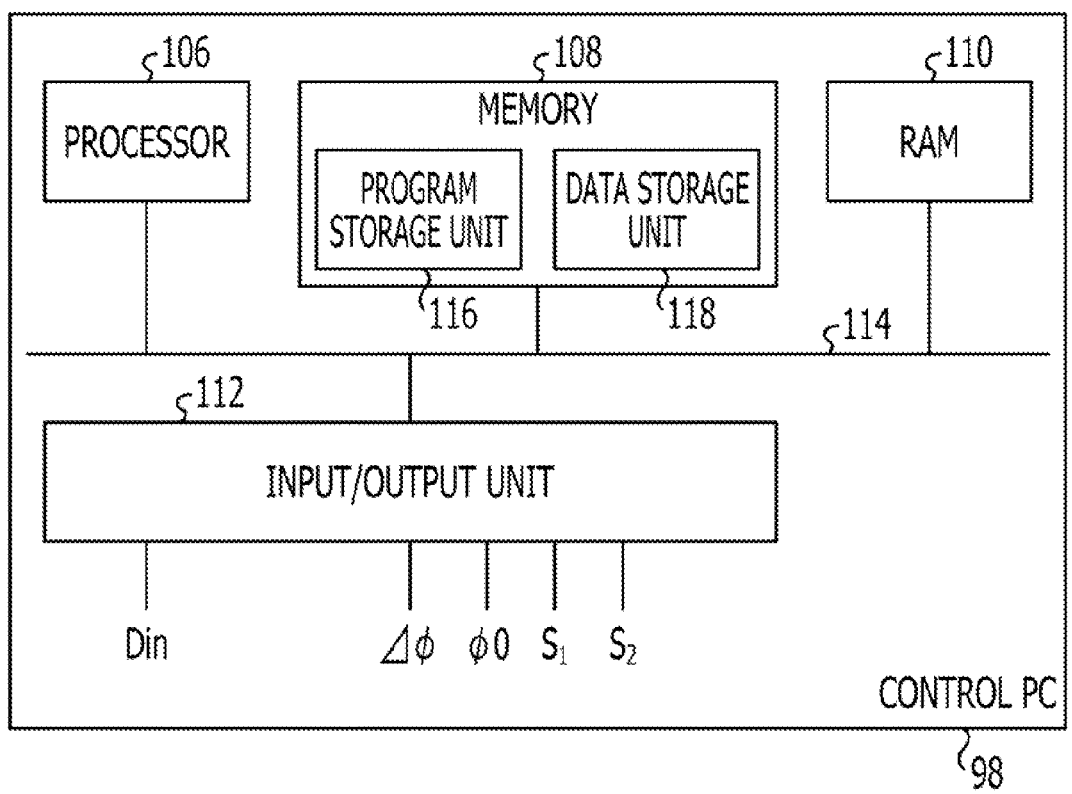
FIG. 17 illustrates an example of a configuration of a control computer.

The control PC 98 of the phase controller 82 may include, for example, a personal computer. The control PC 98 illustrated in FIG. 17 is merely an example and the present invention is not limited to such a configuration. The control PC 98 illustrated in FIG. 17 includes a bus 114 connected to a processor 106, a memory 108, a RAM 110, and an input/output unit 112. The processor 106 executes programs in the memory 108 to generate the selection signals for the abovementioned selectors 90 and 100.

The memory 108 includes a program storage unit 116 and a data storage unit 118. Various application programs such as an operating system (OS) and the abovementioned phase control programs for controlling the phase are recorded in the program storage unit 116. The target phase difference Asp, the reference phase φ0, detected data, and data being computed are stored in the data storage unit 118. Various types of recording media such as a hard disk drive, CD or DVD ROM, and a semiconductor memory and the like may be used for the memory 108. The RAM 110 temporarily stores data and includes a work area for programs to be executed.

The input/output unit 112 controlled by the processor 106 receives an error detection signal from the controller 94, the abovementioned reference phase φ0 and the target phase difference Δφ are set, and a selection signal S$_1$ is outputted to the selector 90 and a selection signal S$_2$ is outputted to the selector 100.

Figure 18:
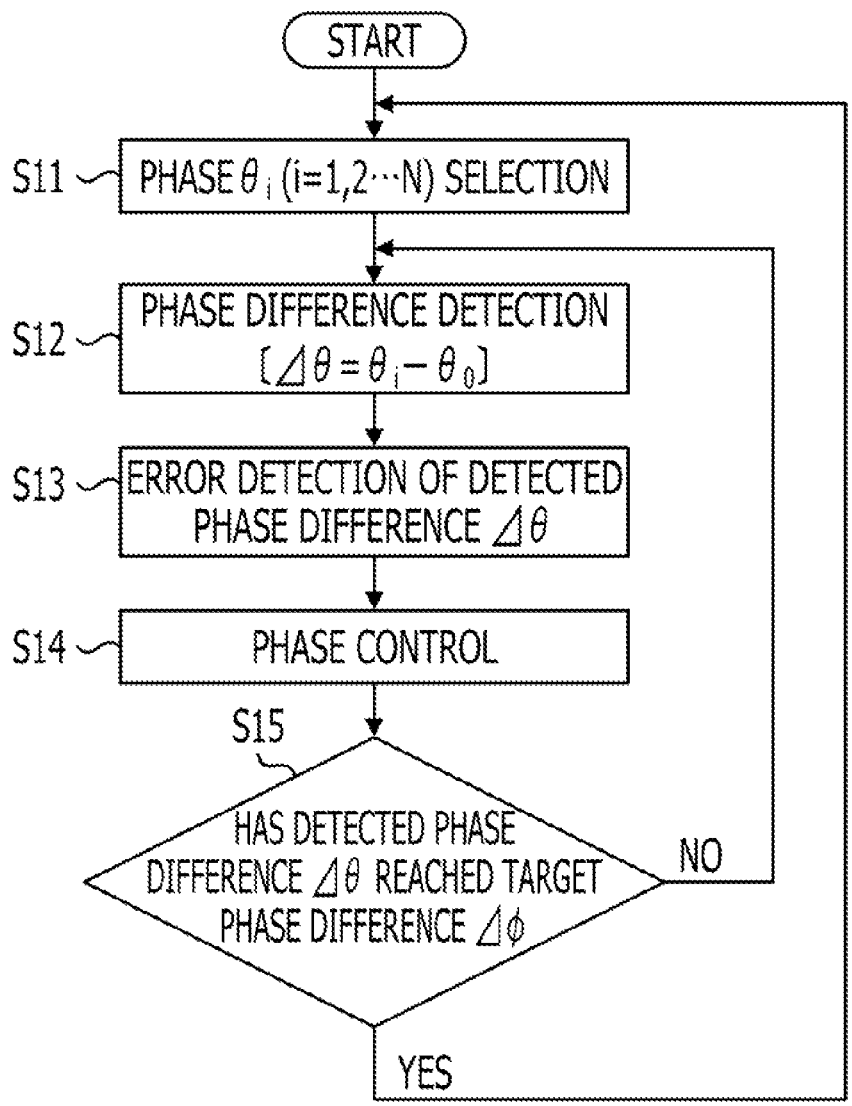
FIG. 18 is a flowchart illustrating phase control operations.

The phase difference control by the phase controller 82 is described with reference to FIG. 18. The phase difference control processing illustrated in FIG. 18 is merely an example and the present invention is not limited to such processing.

The processing is an example of a phase control method disclosed herein. In the processing illustrated in FIG. 18, any of the phases θi (=θ$_1$, θ$_2$, ... θ$_N$) that are control targets are selected by the selector 90 (operation S11). Accordingly, any of the microwaves M$_1$ to M$_4$ are selected by the selector 100. If the phase θ$_1$ is selected for example, the input side microwave M$_1$ is selected.

The detected phase θi and the master side reference phase θ$_0$ are compared. In this case, the phase difference Δθ derived from Δθ=θi−θ$_0$ is outputted (operation S12). The detected phase difference Δθ is compared with the target phase difference Δφ from the control PC 98, and an error is derived in relation to the target phase difference Δφ of the detected phase difference Δθ (operation S13).

The phase control is conducted using the error (operation S14). In this case, the phase shifter 84 of the phase control transmitter 781 is selected through the selector 100 to become the control input. As a result, the phase of the microwave M$_1$ is shifted.

A operation is conducted to determine whether the detected phase difference Δθ matches the target phase difference Δφ (operation S15). If the detected phase difference Δθ does not match the target phase difference Δφ (operation S15: NO), the processing returns to operation S12 to continue the phase control.

If the detected phase difference Δθ matches the target phase difference Δφ (operation S15: YES), the processing returns to operation S11 where the next phases θ$_2$ to θ$_N$ are selected and any of the phase shifters 84 controlled by the phase control transmitters 782 to 78N are similarly selected. The abovementioned phase control is conducted continuously.

Thus, phases of the microwave outputs are controlled to a set phase while the microwaves are being transmitted, and as a result, optimal efficiency of the power transmission may be obtained and maintained.

Features and advantages of the fourth embodiment are listed as follows.

(1) The control of the microwave output phases is conducted by making any one of a plurality of phase control transmitters 780, 781, 782, ... 78N, for example the phase control transmitter 780, a reference transmitter, and making the other phase control transmitters 780, 781, 782, ... 78N slave transmitters, and then detecting the phase difference thereof.

(2) A target phase difference Δφ is outputted to the phase control transmitters 780, 781, 782, ... 78N from the control PC 98. The target phase difference Δφ (set phase difference) is compared with the detected phase difference Δθ and an error is calculated in the error detector 104. The error output is applied to the phase shifters 84 of the phase control transmitters 780, 781, 782, ... 78N corresponding to the slave side as a phase control value to thereby control the phase shifters 84 to match the target phase difference Δφ.

(3) Output signal variation does not occur in the phase controller 82 included in the abovementioned phase difference control FB system since the phase difference detector 102 output is in a continuous section despite the occurrence of fluctuation in the control targets (e.g., phase control transmitters 780, 781, 782, ... 78N) when the target phase difference Δφ is set to 270 degrees (=−90 degrees).

(4) When the output voltage has a phase difference of 90 degrees or less, the phase difference detector 102 generates the reset signal RESET as described in the second embodiment such that the detected phase difference is controlled to be 450 degrees. As a result, the phase difference control FB system, specifically the phase controller 82, may conduct control within the section of the continuous phase difference detection characteristics even if the target phase difference is set to 90 degrees (=−90 degrees).

(5) Continuous input/output characteristics for any phase difference may be realized in a phase difference FB control device for keeping the phase difference of multiple output signals of microwave wireless power transmission devices and the like at a certain fixed value.

(6) The control of microwave output phases may be conducted to optimize power transmission efficiency when space photovoltaic power generation microwave power transmission devices transmit microwave outputs.

Other Embodiments (1) Although a space photovoltaic power generation system is described as an example in the above embodiments, the present invention is not limited to the above embodiments. For example, the above embodiments may be applied to a microwave power transmission device for an electric automobile charging system and the like. The above embodiments may be widely used in phase difference detection and phase control of a phase difference control feedback system that freely sets the phase differences of multiple microwave signals.

(2) The present invention may be used in a broadband power PLL circuit used for wireless and optical transmission devices for mobile communication, video transmission, digital TV broadcasting and the like, and other various types of consumer products and the like.

(3) The third embodiment describes providing two D-FFs on the signal input In2 side for frequency-dividing. However, the embodiment is not limited as such. That is, one or three or more D-FFs may be provided. Similarly, although one D-FF is provided at the signal input In2 side, the embodiment is not limited as such. That is, assuming that the number of frequency-dividing stages by D-FFs at the signal input In2 side is "n," the number of frequency-dividing stages by D-FFs at the In2 side may be "n/2." According to this type of configuration, a configuration in which the phase detection range may be further increased beyond 720 degrees mentioned in the above embodiments for obtaining the phase difference may be used. A configuration that conducts phase control with the above detected phase difference may also be used.

(4) Although the hardware configuration of the above embodiments is illustrated as a logic circuit and the like that indicate discrete elements, the present invention is not limited to such a configuration. A circuit configured of software that implements functions that are equivalent to the discrete elements by conducting programs stored in a recording medium may be used.

Comparative Example

Figure 19:
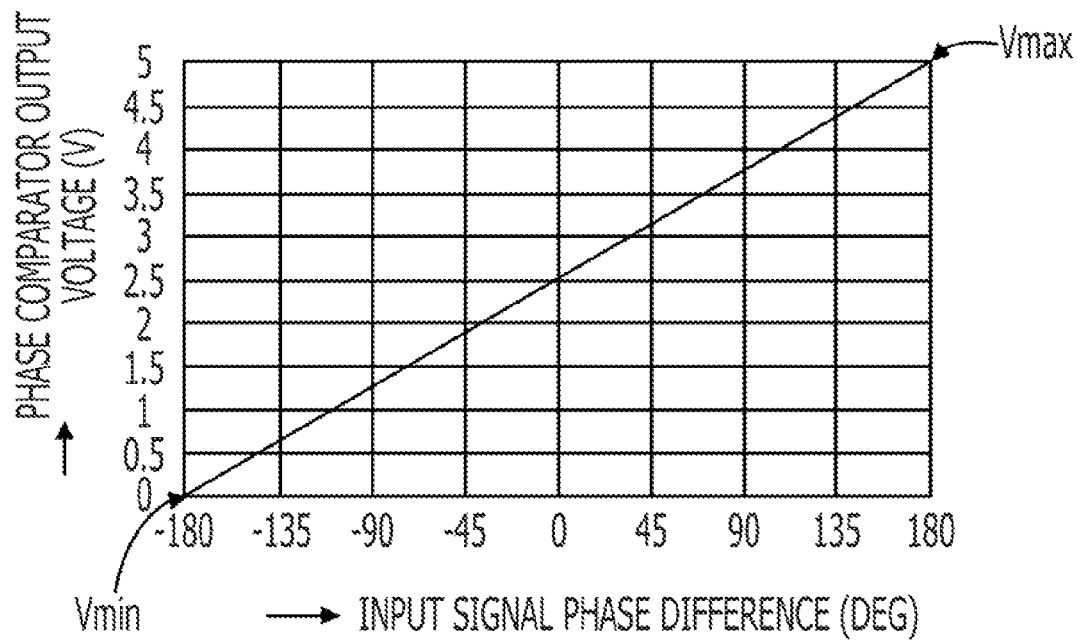
FIG. 19 illustrates input and output characteristics of a phase comparator indicating a comparative example.

A comparative example of the above embodiments will be described with reference to FIGS. 19 and 20A to 20C. FIG. 19 illustrates example of input/output characteristics of a phase comparator. FIGS. 20A to 20C illustrate fluctuations of the detected phase difference.

A phase difference control FB system in a conventional microwave power transmission device uses a phase comparator used in a normal PLL circuit and detects the phase difference of targeted microwaves. Such a phase comparator exhibits the input/output characteristics illustrated in FIG. 19. The example of input/output characteristics have a phase difference output voltage of 0 V to 5 V with respect to a phase difference range of an input signal phase difference of −180 degrees to +180 degrees.

The normal PLL circuit conducts filtering of the phase comparator output obtained from the input/output characteristics illustrated in FIG. 19 and controls the phase to approximate the center value of the phase comparator output voltage, namely phase difference=0 degrees, such that the comparator output voltage=2.5 V, by providing feedback to a control target (VCO).

Accordingly, freely controlling the phase difference of 0 to 360 degrees is required in the microwave power transmission device phase difference control FB system. The following problem arises when this type of phase difference control FB system uses a phase comparator having the input/output characteristics illustrated in FIG. 19.

When the target phase difference of the phase difference control FB system is set to a phase difference of 180 degrees for example, the phase comparator output is controlled to approximate the maximum value (Vmax=5 V). However, since control target fluctuations actually occur, the detected phase difference exhibits variation (phase difference fluctuation) in the +180 degree to −180 degree range. As a result, the phase comparator output also exhibits a large variation (voltage fluctuation) of the maximum (Vmax=+5 V) and minimum (Vmin=0 V) range. When conducting filtering of voltage accompanied with such voltage fluctuation, the obtained phase difference detection output signals approximate the center value (Vmean=+2.5 V) of the maximum (Vmax=+5 V) and minimum (Vmin=0 V) values, namely the phase difference becomes 0 degrees. As a result, controlling the phase difference to satisfy a desired phase difference (=180 degrees) may not be achieved. This type of problem is solved by the above embodiments.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method used by a phase difference detection circuit for detecting a phase difference between two signals, the method comprising:
   shifting a detected phase difference between the two signals by an offset value;
   outputting the detected phase difference; and
   controlling the offset value such that the outputted detected phase difference falls within a phase difference range between a lower limit and an upper limit.

2. The method according to claim 1, wherein the offset value is added to or subtracted from one of the two signals.

3. The method according to claim 1, wherein the two signals are a first signal and a second signal, the method further comprising:
   generating a frequency-divided signal of the first signal, and an inverted signal and a non-inverted signal of the second signal;
   comparing the frequency-divided signal of the first signal with the inverted signal or the non-inverted signal of the second signal to detect a phase difference;
   determining whether the detected phase difference has reached the upper limit or the lower limit; and
   switching the inverted signal to the non-inverted signal if the inverted signal is used at a time point when the detected phase difference has reached the upper limit or the lower limit, or switching the non-inverted signal to the inverted signal if the non-inverted signal is used at the time point.

4. The method according to claim 1 further comprising:
   detecting an error between the controlled detected phase difference within the phase difference range and a set phase difference; and
   controlling at least one of a signal phase of the two signals according to the detected error.

5. A phase difference detection circuit for detecting a phase difference between two signals, the phase difference detection circuit comprising:

a phase detector to shift a detected phase difference between the two signals by an offset value and output the detected phase difference; and an offset controller to control the offset value such that the detected phase difference outputted by the phase detector falls within a phase difference range between a lower limit and an upper limit.

6. The phase difference detection circuit according to claim 5, wherein the offset controller adds the offset value to one of the two signals or subtracts the offset value from one of the two signals.

7. The phase difference detection circuit according to claim 5, wherein the two signals are a first signal and a second signal; and wherein the phase detector frequency-divides the first signal and generates an inverted signal and a non-inverted signal from the second signal, compares the frequency-divided signal of the first signal and the inverted signal or the non-inverted signal of the second signal to detect a phase difference; and the offset controller includes a determining unit to determine whether the detected phase difference has reached the upper limit or the lower limit, and switches the inverted signal to the non-inverted signal if the inverted signal is used at a time point when the detected phase difference has reached the upper limit or the lower limit, or switches the non-inverted signal to the inverted signal if the non-inverted signal is used at the time point.

8. The phase difference detection circuit according to claim 5, wherein the offset controller converts a phase difference pulse indicating the detected phase detected by the phase detector to a direct current signal, generates an output when a level of the direct current signal indicates the phase difference falls within the phase difference range, and generates a control signal to switch the offset value based on the output.

9. A wireless electric power transmission device comprising:

an electric power source;

a plurality of converters to convert outputs from the electric power source to wireless signals, respectively;

a phase detector to detect a phase difference between two signals selected from a plurality of wireless signals of the converters, and to shift the detected phase difference to an offset value and then output the detected phase difference;

an offset controller to control the offset value such that the outputted detected phase difference falls within a phase difference range;

an error detector to detect an error between the detected phase difference outputted by the phase detector and a set phase difference; and a phase controller to control at least one signal phase of the two signals according to the error detected by the error detector.

* * * * *